United States Patent
Northrup et al.

(10) Patent No.: US 12,352,803 B2
(45) Date of Patent: Jul. 8, 2025

(54) DEVICE FOR AND METHOD OF FREQUENCY TESTING PRINTED CIRCUIT BOARD UNDER THERMAL STRESS

(71) Applicant: Raytheon Company, Arlington, VA (US)

(72) Inventors: Mark Ryan Northrup, Marana, AZ (US); Andrew Ryan Rodack, Tucson, AZ (US); Matthew E. Riley, Tucson, AZ (US); Maxwell John Hamilton, Marana, AZ (US)

(73) Assignee: Raytheon Company, Arlington, VA (US)

( * ) Notice: Subject to any disclaimer, the term of this patent is extended or adjusted under 35 U.S.C. 154(b) by 185 days.

(21) Appl. No.: 18/456,010

(22) Filed: Aug. 25, 2023

(65) Prior Publication Data

US 2025/0067792 A1 Feb. 27, 2025

(51) Int. Cl.
*G01R 31/28* (2006.01)
(52) U.S. Cl.
CPC ............... *G01R 31/2817* (2013.01)
(58) Field of Classification Search
CPC .......... H05K 1/0268; H05K 3/429; H05K 2203/162; H05K 2201/09609; H05K 1/0266; H05K 2203/163; H05K 3/0005; H05K 3/4038; H05K 3/42; H05K 3/4685; H05K 3/46; G01R 31/2805; G01R 31/2818; G01R 31/2817; G01R 27/2617; G01R 31/12; G01N 2291/0258; G01N 2203/0062; G01N 2203/0073; G01N 2203/006; G01N 3/18
See application file for complete search history.

(56) References Cited

U.S. PATENT DOCUMENTS 5,172,063 A * 12/1992 Munikoti ............. G01R 31/281
324/763.01
5,392,219 A * 2/1995 Birch .................. G01R 31/2817
714/E11.154
(Continued)

FOREIGN PATENT DOCUMENTS

CA 2042869 8/1995

OTHER PUBLICATIONS

"International Application Serial No. PCT US2024 043089, International Search Report mailed Nov. 15, 2024", 4 pgs.
(Continued)

*Primary Examiner* — Vinh P Nguyen
(74) *Attorney, Agent, or Firm* — Schwegman Lundberg & Woessner, P.A.

(57) ABSTRACT

A printed circuit board (PCB) test system and method including temperature chamber including at least one slot to accommodate at least one PCB test coupon, input bus connected to inputs of the at least one slot, and output bus connected to outputs of the at least one slot, wherein temperature chamber is configured to apply a temperature to the at least one PCB test coupon; signal generator including output bus connected to the input bus of the at least one slot, frequency meter including an input bus connected to the output bus of the at least one slot and an output bus, and a comparator connected to the output bus of the signal generator and the output bus of the frequency meter for comparing corresponding outputs of the signal generator and the frequency meter.

20 Claims, 4 Drawing Sheets

(56) References Cited

U.S. PATENT DOCUMENTS

| | | | |
|---|---|---|---|
| 5,451,885 A | 9/1995 | Birch et al. | |
| 5,659,483 A | 8/1997 | Rhodes et al. | |
| 5,701,667 A | 12/1997 | Birch et al. | |
| 7,129,732 B1 | 10/2006 | Knadle | |
| 7,287,903 B2 | 10/2007 | Estes et al. | |
| 7,596,862 B2 | 10/2009 | Egitto et al. | |
| 10,379,153 B1* | 8/2019 | Neves | G01R 31/2818 |
| 11,081,406 B2* | 8/2021 | Williamson | H01L 23/49827 |
| 12,163,996 B2* | 12/2024 | Bixenman | G01R 31/2808 |
| 2021/0059055 A1 | 2/2021 | Koul et al. | |

OTHER PUBLICATIONS

"International Application Serial No. PCT US2024 043089, Written Opinion mailed Nov. 15, 2024", 4 pgs.

* cited by examiner

DEVICE FOR AND METHOD OF FREQUENCY TESTING PRINTED CIRCUIT BOARD UNDER THERMAL STRESS

BACKGROUND

Conventional printed circuit board (PCB) fabrication typically includes fabricating at least one PCB test coupon on the same substrate on which the PCB is fabricated. A PCB test coupon typically has the same types of features (e.g., trace width, copper weight, via structure, plating, etching, lamination etc.) as the fabricated PCB board. The PCB test coupon may then be separated from the fabricated PCB and tested to determine acceptability of the fabricated PCB. That is, a defect identified in a PCB test coupon may indicate that the same type of defect may appear in a PCB fabricated on the same substrate as the PCB test coupon. If no fatal defect is found in the PCB test coupon, then it may be determined that the fabricated PCB is acceptable for its intended use. Otherwise, the fabricated PCB is determined to be unacceptable for its intended use.

Conventional test methods of a PCB test coupon for determining acceptability of a PCB fabricated on the same substrate as the PCB test coupon include a destructive analysis performed on the PCB test coupon to visually inspect for defects and monitoring resistance during a thermal stress test performed on the PCB test coupon. These methods may be insufficient and/or inadequate to determine acceptability of some fabricated PCBs (e.g., resistance monitoring may not expose issues concerning transmission frequency).

Failure to identify defective fabricated PCBs prior to populating the fabricated PCBs with electrical components for the fabricated PCBs' intended purpose results in lower yields for the fabricated PCBs' intended purpose and greater expenses for correcting for defects at different stages in which the fabricated PCBs may be used (e.g., fabricated PCB stage, assembled PCB stage, assembled system stage, and fielded system stage).

SUMMARY

In accordance with the concepts described herein, exemplary devices and methods provide a PCB acceptability test involving radio frequency (RF) transmission and measurement to determine acceptability of a PCB during thermal stress.

In accordance with the concepts described herein, exemplary devices and methods provide a PCB acceptability test for increasing PCB yield.

In accordance with the concepts described herein, exemplary devices and methods provide a PCB acceptability test for lowering costs to correct defects at each stage of PCB utilization.

DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principles of the concepts described herein. Like reference numerals designate corresponding parts throughout the different views. Furthermore, embodiments are illustrated by way of example and not limitation in the figures, in which.

DETAILED DESCRIPTION

Figure 1:
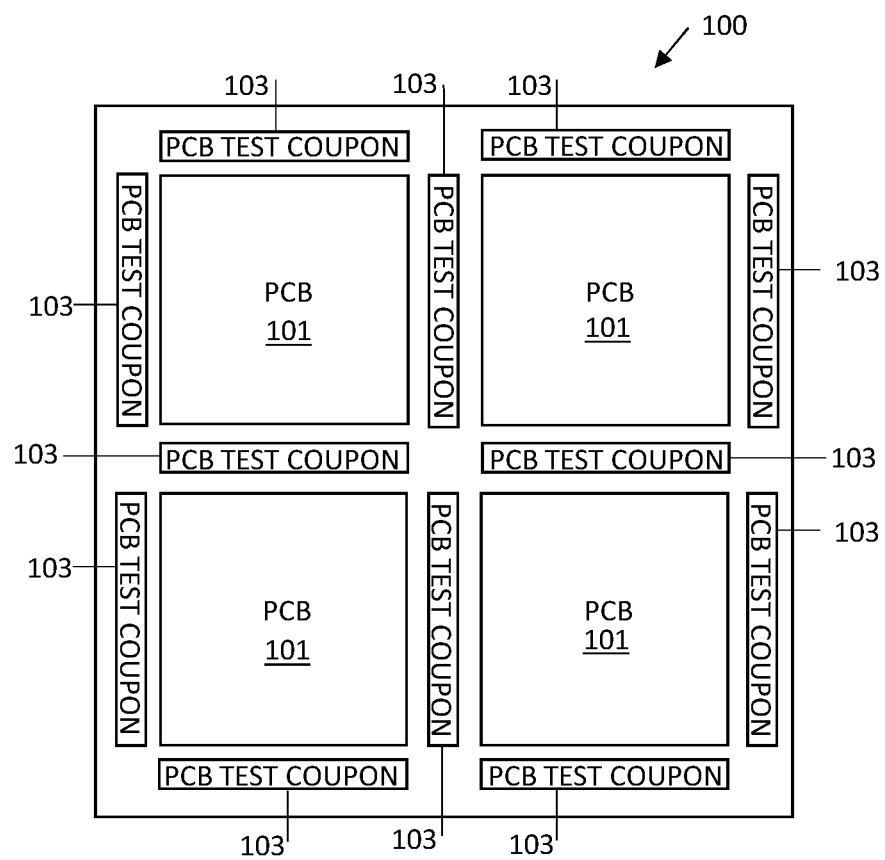
FIG. 1 is an illustration of an exemplary substrate with a plurality of PCBs and a plurality of PCB test coupons according to the present disclosure.

FIG. 1 is an illustration of an exemplary substrate 100 with a plurality of PCBs 101 and a plurality of PCB test coupons 103 according to the present disclosure. In FIG. 1, four PCBs 101 and twelve PCB test coupons 103 are illustrated. However, the present disclosure is not limited thereto. Any number of PCBs 101 and PCB test coupons 103 that may fit on a substrate may be fabricated on the substrate.

Each of the plurality of PCBs 101 may be fabricated with one or more conductive layers. Each of the PCB 101 may be a single-sided PCB, a double-sided PCB, or a multi-conductive-layer PCB, where the number of conductive layers is only limited by how many conductive layers may be fabricated in the PCB 101 by the latest PCB fabrication process. In either a double-sided PCB or a multi-conductive-layer PCB, there may be any number of layers of conductive traces (e.g., copper), conductively plated holes/vias (e.g., through, blind, buried, stacked, staggered, micro), laminate materials, conductive pastes, dielectric materials, solders, graphite, conductive polymers, pastes, epoxies, and adhesive materials in any configuration to fabricate the PCB 101. Conductive traces may traverse, using holes/vias, either both sides of a double-sided PCB or any number of layers in a multi-conductive-layer PCB. Waveguides may also be formed in the PCB 101 using holes/vias.

To determine acceptability of a fabricated at least one PCB 101 for its intended purpose, at least one PCB test coupon 103 may be fabricated on the same substrate 100 as the at least one PCB 101, at the same time, under the same conditions, and using the same materials. Thus, it may be assumed that a same configuration fabricated on the at least one PCB 101 and the at least one PCB test coupon 103 may be approximately physically identical so that acceptability testing of the configuration on the at least one PCB test coupon 103 may indicate acceptability of the configuration on the at least one PCB 101 even though the configuration on the at least one PCB 101 is not tested.

Figure 2:
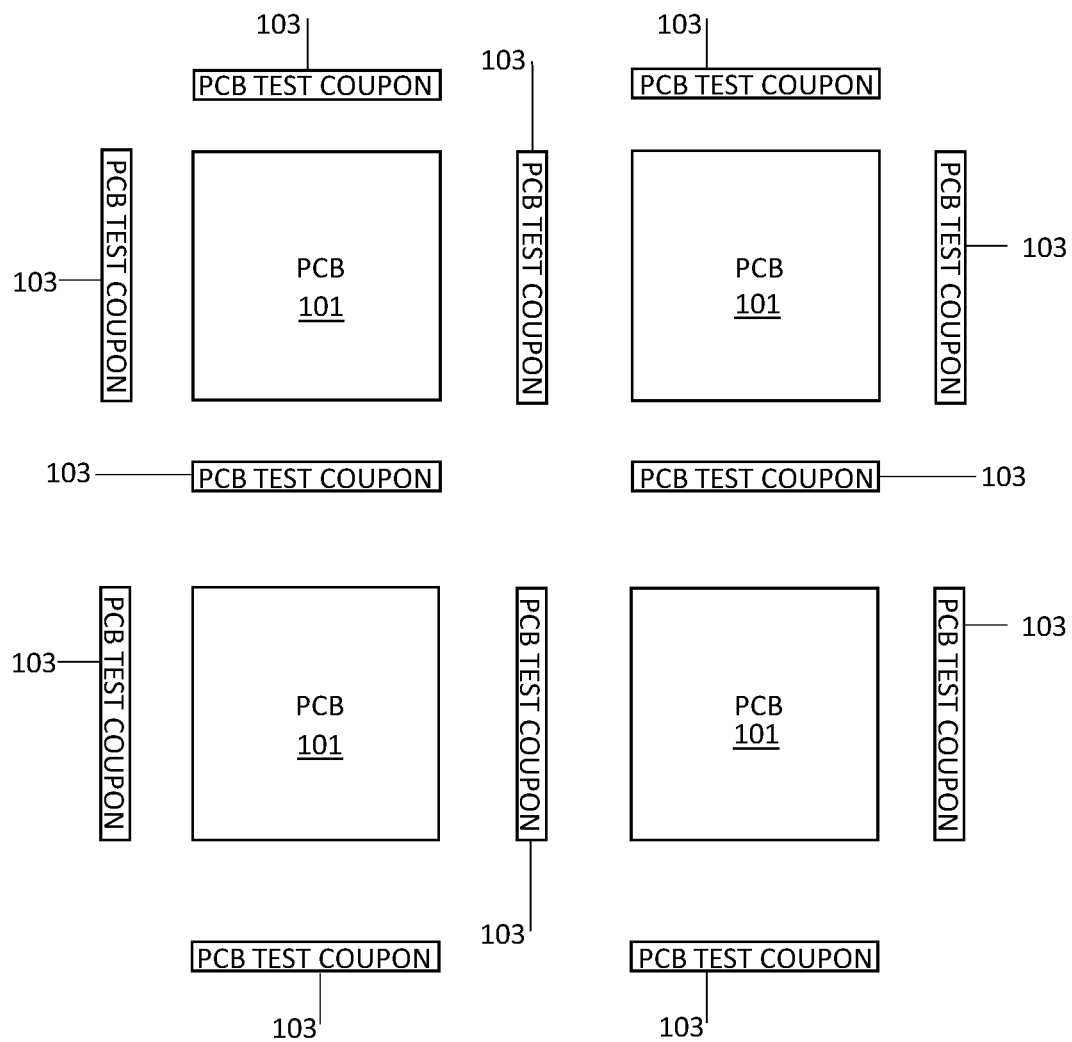
FIG. 2 is an illustration of the plurality of PCBs and the plurality of PCB test coupons of FIG. 1, wherein the plurality of PCBs and the plurality of PCB test coupons are separated from each other, according to the present disclosure.
Figure 3:
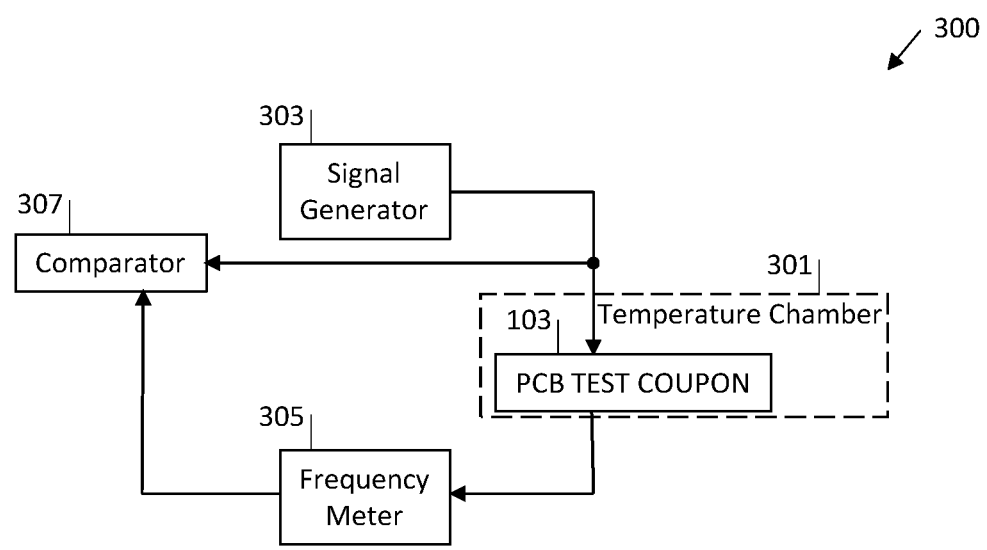
FIG. 3 is an illustration of an exemplary PCB test coupon thermal stress test system according to the present disclosure.

The at least one PCB test coupon 103 may include at least one configuration of conductive traces, holes/vias, waveguides, etc. as in the fabricated at least one PCB 101. The at least one test coupon 103 may then be separated from the substrate 100 as illustrated in FIG. 2 and described below in greater detail. Each configuration on the separated at least one PCB test coupon 103 may then be tested as illustrated in FIG. 3 and described below in greater detail. If all of the configurations on the at least one PCB test coupon 103 pass the test then it may be determined that those configurations were fabricated correctly on the at least one PCB test coupon 103 and, by analogy, that those same configurations were fabricated correctly on the fabricated at least one PCB 101, since those configurations were fabricated on the fabricated at least one PCB 101 and the at least one PCB test coupon 103 at the same time, under the same conditions, and using the same materials. Thus, if the at least one PCB test coupon 103 passes the test then the fabricated at least one PCB 101 may be determined to be acceptable for its intended purpose. Otherwise, the fabricated at least one PCB 101 may be determined to be unacceptable for its intended purpose. In an embodiment, the at least one PC test coupon 103 may include all unique configurations on the fabricated at least one PCB 101.

FIG. 2 is an illustration of the plurality of PCBs 101 and the plurality of PCB test coupons 103 of FIG. 1. The plurality of PCBs 101 and the plurality of PCB test coupons 103 are physically separated from each other so that the plurality of PCB test coupons 103 may be tested as illustrated in FIG. 3 and described below in greater detail.

FIG. 3 is an illustration of an exemplary PCB test coupon thermal stress test system 300 according to the present disclosure. The PCB test coupon thermal stress system 300 comprises a temperature chamber 301 in which at least one PCB test coupon 103 may be thermally tested, a signal generator 303, a frequency meter 305, and a comparator 307.

The temperature chamber 301 includes at least one test slot into which at least one PCB test coupon 103 may be inserted. The temperature chamber 301 may bring the at least one PCB test coupon 103 up to a temperature as high as 260 degrees Celsius (° C.), as low as −55° C., or any temperature in between. In an example, a temperature of at least one PCB test coupon may be established via a thermal couple.

The signal generator 303 comprises an output bus that supplies an input signal to each input of each configuration on the at least one PCB test coupon 103. The input signal may be any discrete frequency (e.g., 1 Hz to 40 GHz, 100 GHz, 500 GHz, 1 Terahertz (THz), etc.) or a ramped frequency. The input signal may be supplied when the at least one PCB test coupon 103 is at a high temperature (e.g., 260° C., 280° C., 400° C., etc.), at a low temperature (e.g., −55° C.), or as the temperature is ramping. The input signal may be continuously supplied while the temperature is changing (e.g., continuous monitoring).

The frequency meter 305 comprises an input bus and an output bus. The input bus is connected to an output of each configuration on the at least one PCB test coupon 103. The frequency meter 305 measures a frequency of each signal at an output of each configuration on the at least one PCB test coupon 103 and outputs those measurements on the output bus of the frequency meter 305.

The comparator 307 is connected to the output bus of the signal generator 303 and the output bus of the frequency meter 305. The comparator 307 compares corresponding output signals from the signal generator 303 and the frequency meter 305. If the frequency of an output of a configuration on the at least one PCB test coupon 103 does not differ from the frequency of the input signal supplied to the input of the configuration of the at least one PCB test coupon 103 by more than a user-definable amount (e.g., 1%, 5%, 10%, etc.) then the processor 303 determines that the at least one PCB test coupon 103 has passed the test and, by analogy, the at least one fabricated PCB 103, which was fabricated along with the at least one PCB test coupon 103, is acceptable for its intended purpose. Otherwise, the comparator 307 determines that the at least one PCB test coupon 103 is unacceptable for its intended purpose. The different amounts of change between the frequency of the input signals from the signal generator 303 and the output signals from the frequency meter may be used for applications that may tolerate different levels of precision. For example, a high-precision application may only tolerate a 1% change in frequency whereas a lower-precision application may tolerate a higher change in frequency (e.g., 5%, 10%, etc.). The cause of a failure of a PCB test coupon 103 may be due to a crack, the environment (e.g., moisture), a void, misalignment, a dimple, an organic material, etc. In an embodiment, the comparator 307 may be a processor.

Figure 4:
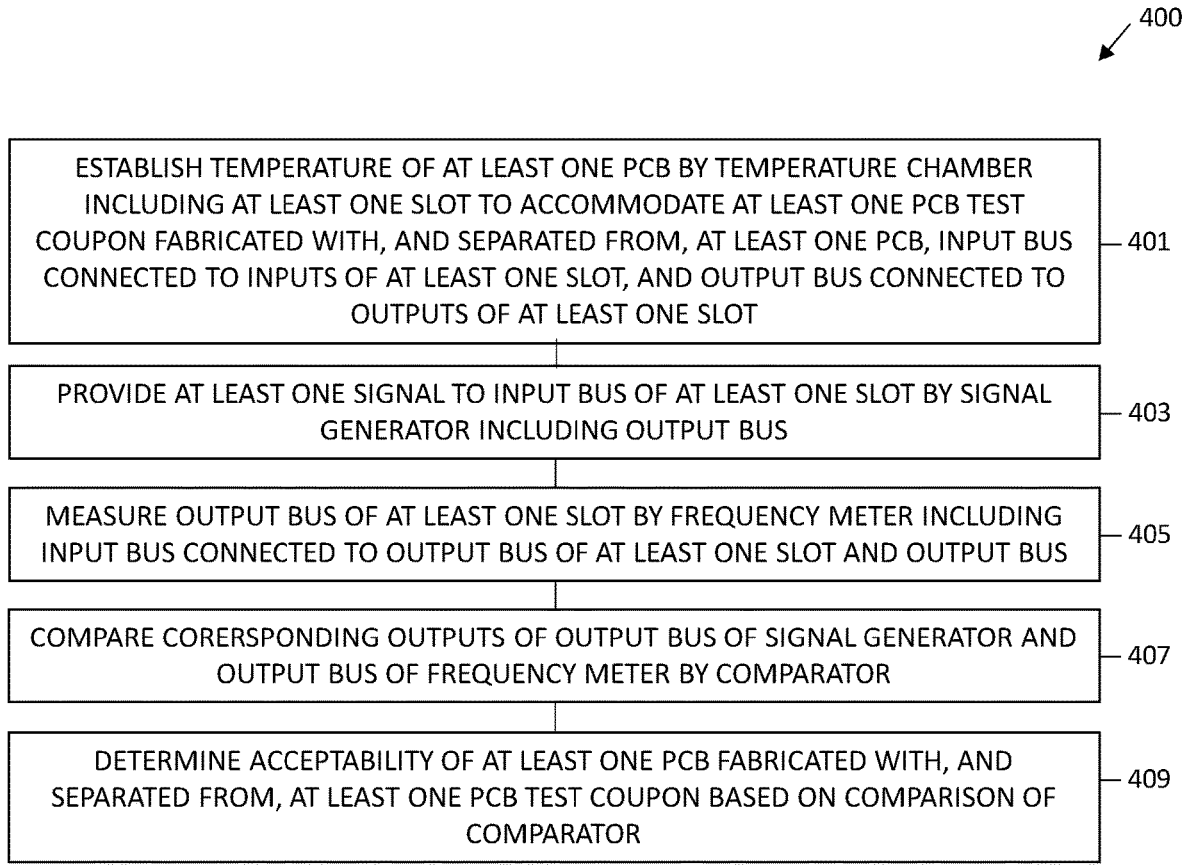
FIG. 4 is a flowchart of an exemplary method of testing a PCB test coupon under thermal stress according to the present disclosure.

FIG. 4 is a flowchart of an exemplary method 400 of testing a PCB test coupon under thermal stress according to the present disclosure. Step 401 of the method 400 comprises establishing a temperature of a PCB by a temperature chamber comprising at least one slot to accommodate at least one PCB test coupon, wherein the at least one PCB test coupon is fabricated with, and separated from, the PCB, an input bus connected to inputs of the at least one slot, and an output bus connected to outputs of the at least one slot. Step 403 of the method 400 comprises providing at least one signal to the input bus of the at least one slot by a signal generator comprising an output bus. Step 405 of the method 400 comprises measuring the output bus of the at least one slot by a frequency meter comprising an input bus connected to the output bus of the at least one slot and an output bus. Step 407 of the method 400 comprises comparing corresponding outputs of the output bus of the signal generator and the output bus of the frequency meter by a comparator. Step 409 of the method 400 comprises determining acceptability of at least one PCB fabricated with, and separated from, the at least one PCB test coupon based on the comparison of the comparator.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

Various embodiments of the concepts, systems, devices, structures and techniques sought to be protected are described herein with reference to the related drawings. Alternative embodiments can be devised without departing from the scope of the concepts, systems, devices, structures and techniques described herein.

It is noted that various connections and positional relationships (e.g., over, below, adjacent, etc.) are set forth between elements in the above description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s). The following definitions and abbreviations are to be used for the interpretation of the claims and the specification. As used herein, the terms "comprises," "comprising, "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "at least one" are understood to include any integer number greater than or equal to one, i.e., one, two, three, four, etc. The terms "a plurality" are understood to include any integer number greater than or equal to two, i.e., two, three, four, five, etc. The term "connection" can include an indirect "connection" and a direct "connection".

References in the specification to "one embodiment, "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description herein, terms such as "upper," "lower," "right," "left," "vertical," "horizontal," "top," "bottom," (to name but a few examples) and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements. Such terms are sometimes referred to as directional or positional terms.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

What is claimed is:

1. A printed circuit board (PCB) test system, comprising:
    a temperature chamber comprising;
        at least one slot to accommodate at least one PCB test coupon;
        an input bus connected to inputs of the at least one slot; and
        an output bus connected to outputs of the at least one slot, wherein the temperature chamber is configured to apply a temperature to the at least one PCB test coupon;
    a signal generator comprising an output bus connected to the input bus of the at least one slot;
    a frequency meter comprising an input bus connected to the output bus of the at least one slot and an output bus; and
    a comparator connected to the output bus of the signal generator and the output bus of the frequency meter for comparing corresponding outputs of the signal generator and the frequency meter and determining acceptability of at least one PCB fabricated with, and separated from, the at least one PCB test coupon.

2. The PCB test system of claim 1, wherein the at least one PCB test coupon comprises at least one circuit board configuration present on the at least one PCB fabricated with, and separated from, the at least one PCB test coupon.

3. The PCB test system of claim 1, wherein the at least one PCB fabricated with, and separated from, the at least one PCB test coupon comprises a single-sided PCB, a double-sided PCB, and/or a multi-conductive-layer PCB.

4. The PCB test system of claim 2, wherein the at least one circuit board configuration comprises at least one layer of conductive traces, conductively plated holes/vias, laminate materials, conductive pastes, dielectric materials, solder, conductive polymer, paste, graphite, adhesive materials, and/or at least one waveguide.

5. The PCB test system of claim 4, wherein the conductively plated holes/vias comprise through holes/vias, blind holes/vias, buried holes/vias, stacked holes/vias, staggered holes/vias, and/or micro holes/vias.

6. The PCB test system of claim 1, wherein the at least one PCB test coupon comprises all unique circuit board configurations present on the at least one PCB fabricated with, and separated from, the at least one PCB test coupon.

7. The PCB test system of claim 1, wherein the temperature chamber is configured to apply a temperature in a range of approximately 260° C. to 400° C.

8. The PCB test system of claim 1, wherein the temperature chamber is configured to apply a temperature in a range of approximately −55° C. to 100° C.

9. The PCB test system of claim 1, wherein the comparator is configured to determine acceptability of the at least one PCB fabricated with, and separated from, the at least one PCB test coupon when the comparison between corresponding outputs of the signal generator and the frequency meter is not more that 1%, 5%, and/or 10%, depending on a precision of the at least one PCB fabricated with, and separated from, the at least one PCB test coupon.

10. The PCB test system of claim 1, wherein the signal generator outputs at least one discrete signal or a ramped signal in a frequency range of 1 Hz to 1 Terahertz (THz).

11. A method of determining acceptability of at least one printed circuit board (PCB), comprising:
establishing a temperature of the at least one PCB by a temperature chamber comprising:
at least one slot to accommodate at least one PCB test coupon, wherein the at least one PCB test coupon is fabricated with, and separated from, the at least one PCB;
an input bus connected to inputs of the at least one slot; and
an output bus connected to outputs of the at least one slot;
providing at least one signal to the input bus of the at least one slot by a signal generator comprising an output bus;
measuring the output bus of the at least one slot by a frequency meter comprising an input bus connected to the output bus of the at least one slot and an output bus;
comparing corresponding outputs of the output bus of the signal generator and the output bus of the frequency meter by a comparator; and
determining acceptability of the at least one PCB fabricated with, and separated from, the at least one PCB test coupon based on the comparison of the comparator.

12. The method of claim 11, wherein the at least one PCB test coupon comprises at least one circuit board configuration present on the at least one PCB fabricated with, and separated from, the at least one PCB test coupon.

13. The method of claim 11, wherein the at least one PCB fabricated with, and separated from, the at least one PCB test coupon comprises a single-sided PCB, a double-sided PCB, and/or a multi-conductive-layer PCB.

14. The method of claim 12, wherein the at least one circuit board configuration comprises at least one layer of conductive traces, conductively plated holes/vias, laminate materials, conductive pastes, dielectric materials, solder, conductive polymer, paste, graphite, adhesive materials, and/or at least one waveguide.

15. The method of claim 14, wherein the conductively plated holes/vias comprise through holes/vias, blind holes/vias, buried holes/vias, stacked holes/vias, staggered holes/vias, and/or micro holes/vias.

16. The method of claim 11, wherein the at least one PCB test coupon comprises all unique circuit board configurations present on the at least one PCB fabricated with, and separated from, the at least one PCB test coupon.

17. The method of claim 11, wherein the temperature chamber applies a temperature in a range of approximately 260° C. to 400° C.

18. The method of claim 11, wherein the temperature chamber applies a temperature in a range of approximately −55° C. to −100° C.

19. The method of claim 11, wherein the comparator further determines acceptability of at least one PCB fabricated with, and separated from, the at least one PCB test coupon when the comparison between corresponding outputs of the signal generator and the frequency meter is not more that 1%, 5%, and/or 10%, depending on a precision of the at least one PCB fabricated with, and separated from, the at least one PCB test coupon.

20. The method of claim 11, wherein the signal generator outputs at least one discrete signal or a ramped signal in a frequency range of 1 Hz to 1 Terahertz (THz).

* * * * *

UNITED STATES PATENT AND TRADEMARK OFFICE
CERTIFICATE OF CORRECTION

| | | |
|---|---|---|
| PATENT NO. | : 12,352,803 B2 | Page 1 of 1 |
| APPLICATION NO. | : 18/456010 | |
| DATED | : July 8, 2025 | |
| INVENTOR(S) | : Northrup et al. | |

It is certified that error appears in the above-identified patent and that said Letters Patent is hereby corrected as shown below:

In the Drawings

Sheet 4 of 4, Fig. 4, reference numeral 407, Line 1, delete "CORERSPONDING" and insert --CORRESPONDING-- therefor In the Specification In Column 3, Line 60, delete "103," and insert --101,-- therefor Signed and Sealed this
Twenty-seventh Day of January, 2026

John A. Squires
*Director of the United States Patent and Trademark Office*